(12) United States Patent
Yang et al.

(10) Patent No.: US 11,942,179 B2
(45) Date of Patent: Mar. 26, 2024

(54) THRESHOLD VOLTAGE VARIATION COMPENSATION IN INTEGRATED CIRCUITS

(71) Applicant: Macronix International Co., Ltd., Hsinchu (TW)

(72) Inventors: Shang-Chi Yang, Changhua County (TW); Hui-Yao Kao, New Taipei (TW)

(73) Assignee: Macronix International Co., Ltd., Hsinchu (TW)

( * ) Notice: Subject to any disclaimer, the term of this patent is extended or adjusted under 35 U.S.C. 154(b) by 166 days.

(21) Appl. No.: 17/717,657

(22) Filed: Apr. 11, 2022

(65) Prior Publication Data

US 2023/0326493 A1    Oct. 12, 2023

(51) Int. Cl.
| | | |
|---|---|---|
| *G11C 11/06* | (2006.01) | |
| *G11C 7/06* | (2006.01) | |
| *G11C 7/08* | (2006.01) | |

(52) U.S. Cl.
CPC .............. *G11C 7/065* (2013.01); *G11C 7/08* (2013.01)

(58) Field of Classification Search
CPC ....... G11C 7/065; G11C 7/08; G11C 16/0483; G11C 7/12; G11C 2207/2245; G11C 2211/5642; G11C 7/1039; G11C 16/24; G11C 16/26

USPC ......................................................... 365/244
See application file for complete search history.

(56) References Cited

U.S. PATENT DOCUMENTS

| | | | |
|---|---|---|---|
| 7,046,568 B2 * | 5/2006 | Cernea ................... | G11C 16/28 365/207 |
| 8,787,087 B2 * | 7/2014 | Maeda ................... | G11C 16/08 365/185.11 |
| 9,142,308 B2 * | 9/2015 | Lee ......... | G11C 16/26 |
| 9,620,236 B2 | 4/2017 | Moschiano et al. | |
| 2009/0161433 A1 * | 6/2009 | Lee ......... | G11C 16/30 365/185.12 |
| 2015/0243351 A1 | 8/2015 | Moschiano et al. | |
| 2016/0027504 A1 | 1/2016 | Lee | |

FOREIGN PATENT DOCUMENTS

TW            201711172         3/2017

* cited by examiner

*Primary Examiner* — Tha-O H Bui
(74) *Attorney, Agent, or Firm* — Fish & Richardson P.C.

(57) ABSTRACT

Systems, methods, circuits, and apparatuses for managing integrated circuits in memory devices are provided. In one aspect, an integrated circuit includes: a latch circuit including a latch and a sensing transistor coupled to the latch, and a compensation circuit coupled to the sensing transistor. The sensing transistor includes a gate terminal coupled to a sensing node and an additional terminal coupled to the compensation circuit, and the compensation circuit is configured to apply a control voltage to the additional terminal to compensate for a variation of a threshold voltage of the sensing transistor.

20 Claims, 11 Drawing Sheets

700

| Provide a control voltage to a sensing transistor of the integrated circuit, the sensing transistor including a gate terminal coupled to a sensing node and another terminal configured to receive the control voltage | ⟵ 702 |

↓

| Discharge a sensing voltage at the sensing node through a bit line coupled to a memory cell | ⟵ 704 |

↓

| Determine a state of the memory cell based on (i) the discharged sensing voltage and (ii) a target voltage based on the control voltage and on a threshold voltage of the sensing transistor, wherein the control voltage is configured to compensate for a variation of the threshold voltage of the sensing transistor, such that the target voltage is independent from the variation of the threshold voltage of the sensing transistor. | ⟵ 706 |

FIG. 7

THRESHOLD VOLTAGE VARIATION COMPENSATION IN INTEGRATED CIRCUITS

BACKGROUND

Integrated circuit memory devices are becoming smaller and faster. During readout of memory devices, a sensing transistor is switched on or off depending on a state of a memory cell (0 or 1). A state of the sensing transistor can be probed to determine the state of the memory cell.

SUMMARY

The present disclosure describes systems and techniques for managing integrated circuits (e.g., page buffer circuits) in memory devices (e.g., non-volatile memory devices such as flash memories), e.g., by threshold voltage variation compensation in the integrated circuits.

Some aspects of the present disclosure feature an integrated circuit including: a latch circuit including a latch and a sensing transistor coupled to the latch; and a compensation circuit coupled to the sensing transistor. The sensing transistor includes a gate terminal coupled to a sensing node and an additional terminal coupled to the compensation circuit. The compensation circuit is configured to apply a control voltage to the additional terminal to compensate for a variation of a threshold voltage of the sensing transistor.

This and other integrated circuits described in this disclosure can have any one or more of at least the following characteristics.

In some implementations, the control voltage is based on a predetermined voltage and on a matching voltage configured to have a variation substantially the same as the variation of the threshold voltage of the sensing transistor.

In some implementations, the matching voltage is substantially identical to the threshold voltage of the sensing transistor.

In some implementations, the sensing transistor is configured to receive a sensing voltage at the gate terminal, the sensing transistor is configured to sense a memory cell based on a comparison between the sensing voltage and the predetermined voltage, and the comparison is independent from the variation of the threshold voltage of the sensing transistor.

In some implementations, the sensing transistor is configured to: sense bit "0" stored in the memory cell when the sensing voltage varies in a range between a precharged voltage and the predetermined voltage, and sense bit "1" stored in the memory cell when the sensing voltage is lower than the predetermined voltage.

In some implementations, the range between the precharged voltage and the predetermined voltage is constant and independent from the variation of the threshold voltage of the sensing transistor.

In some implementations, the compensation circuit includes a compensation transistor that matches the sensing transistor.

In some implementations, the compensation transistor includes: a compensation gate terminal coupled to a predetermined voltage; a first terminal coupled to a supply voltage; and a second terminal coupled to an input of a buffer circuit that is configured to provide the control voltage at an output.

In some implementations, the control voltage is based on the predetermined voltage and on the threshold voltage of the compensation transistor.

In some implementations, the control voltage is identical to a difference between the predetermined voltage and the threshold voltage of the compensation transistor.

In some implementations, the threshold voltage of the sensing transistor varies in a range between a higher threshold voltage and a lower threshold voltage, and the predetermined voltage is greater than or equal to the higher threshold voltage.

In some implementations, the compensation circuit is configured to provide the control voltage at a source terminal of the compensation transistor.

In some implementations, the control voltage is a function of the threshold voltage of the sensing transistor.

In some implementations, the compensation circuit is configured to apply the control voltage such that the control voltage decreases in response to an increase in the threshold voltage, and such that the control voltage increases in response to a decrease in the threshold voltage.

In some implementations, the compensation circuit is configured to apply the control voltage such that the control voltage decreases in response to a decrease in temperature, and such that the control voltage increases in response to an increase in temperature.

In some implementations, the additional terminal includes a source terminal of the sensing transistor.

In some implementations, the compensation circuit is configured to apply the control voltage such the sensing transistor is turned on or off independent of the variation of the threshold voltage of the sensing transistor.

In some implementations, the variation of the threshold voltage of the sensing transistor is based on at least one of a temperature change or a process variation in fabrication of the sensing transistor.

In some implementations, the control voltage causes a turn-on condition of the sensing transistor to be independent of temperature changes within a predetermined temperature range.

In some implementations, the control voltage causes a switching voltage of the sensing transistor to be independent of process variations in fabrication of the sensing transistor.

In some implementations, the sensing transistor includes a third terminal configured to receive current flow during a readout operation of the integrated circuit.

In some implementations, the integrated circuit includes a precharging circuit coupled to the sensing node and configured to precharge the sensing node to a supply voltage during a precharging phase.

In some implementations, the integrated circuit include a bit line control circuit having a first control node coupled to a bit line for a memory cell and a second control node coupled to the sensing node. The bit line control circuit is configured to: precharge the bit line during the precharging phase, and discharge a sensing voltage of the sensing node by conductively connecting the sensing node with the bit line to provide a sensing current to the memory cell during a discharging phase subsequent to the precharging phase.

In some implementations, the latch circuit is configured such that, during a readout phase: when the memory cell stores bit "1" and the sensing voltage at the sensing node is no greater than a target voltage, and the sensing transistor is turned off to keep a bit value latched in the latch to be "1", and when the memory cell stores bit "0" and the sensing voltage at the sensing node is greater than the target voltage, and the sensing transistor is turned on to set a bit value latched in the latch to be "0".

In some implementations, the sensing transistor is configured to receive a sensing voltage at the gate terminal, the sensing transistor is configured to sense a memory cell based on a comparison between the sensing voltage and the predetermined voltage, and the compensation circuit is configured to apply the control voltage such that the predetermined voltage is greater than a common voltage at a common node coupled to the gate terminal through an additional transistor.

In some implementations, the integrated circuit includes a capacitor coupled to the sensing node.

Some aspects of the present disclosure describe a memory device that includes: a memory cell array including a plurality of memory cells; a plurality of memory cell lines connecting respective lines of memory cells in the memory cell array; and a page buffer circuit including a plurality of page buffers coupled to the plurality of memory cell lines. Each page buffer includes: a latch circuit including a latch and a sensing transistor coupled to the latch; and a compensation circuit coupled to the sensing transistor. The sensing transistor includes a gate terminal coupled to a sensing node, a first terminal coupled to the latch, and a second terminal coupled to the compensation circuit. The compensation circuit is configured to apply a control voltage to the second terminal to compensate for a variation of a threshold voltage of the sensing transistor.

Aspects of this and other memory devices described in this disclosure can have any one or more of at least the following characteristics.

In some implementations, the sensing transistor is configured to receive a sensing voltage at the gate terminal, the sensing transistor is configured to sense a memory cell based on a comparison between the sensing voltage and a predetermined voltage, and the comparison is independent from the variation of the threshold voltage of the sensing transistor.

In some implementations, the compensation circuit includes a compensation transistor that matches the sensing transistor, and a threshold voltage of the compensation transistor is substantially identical to the threshold voltage of the sensing transistor.

In some implementations, the compensation transistor includes: a compensation gate terminal coupled to a predetermined voltage; a third terminal coupled to a supply voltage; and a fourth terminal coupled to an input of a buffer circuit that is configured to provide the control voltage at an output.

Some aspects of the present disclosure describe an integrated circuit including: a latch configured to latch data; and a sensing transistor including a gate terminal coupled to a sensing node, a first terminal coupled to the latch, and a second terminal to receive a control voltage. The sensing transistor is configured to be turned on or off to update the data in the latch based on (i) a sensing voltage at the sensing node and (ii) a target voltage based on the control voltage and on a threshold voltage of the sensing transistor. The control voltage is configured to compensate for a variation of the threshold voltage of the sensing transistor, such that the target voltage is independent from the variation of the threshold voltage of the sensing transistor.

Some aspects of this disclosure describe a method of managing an integrated circuit. The method includes: providing a control voltage to a sensing transistor of the integrated circuit, the sensing transistor including a gate terminal coupled to a sensing node and another terminal configured to receive the control voltage; discharging a sensing voltage at the sensing node through a bit line coupled to a memory cell; and determining a state of the memory cell based on (i) the discharged sensing voltage and (ii) a target voltage based on the control voltage and on a threshold voltage of the sensing transistor. The control voltage is configured to compensate for a variation of the threshold voltage of the sensing transistor, such that the target voltage is independent from the variation of the threshold voltage of the sensing transistor.

This and other methods described in this disclosure can have any one or more of at least the following characteristics.

In some implementations, providing the control voltage includes providing a lower control voltage in response to an increase in the threshold voltage, and providing a higher control voltage in response to a decrease in the threshold voltage.

In some implementations, providing the control voltage includes providing a lower control voltage in response to a decrease in temperature, such that the control voltage increases in response to an increase in temperature.

In some implementations, the other terminal includes a source terminal of the sensing transistor.

In some implementations, providing the control voltage includes providing the control voltage using a compensation circuit including a compensation transistor that matches the sensing transistor.

The techniques and circuit configurations can be implemented for any type of circuit or device that includes a sensing transistor having an on/off state, e.g., indicating a readout result. In some implementations, the on/off state can be made less dependent on or independent from threshold voltage variations in the sensing transistor. In some implementations, temperature-induced threshold voltage variations can be compensated for. In some implementations, process variation-induced threshold voltage variations can be compensated for. In some implementations, a large, stable sensing swing can be provided, improving circuit tolerance of circuit variations. As a result of threshold voltage variation compensation, memory cell readout results can be made more accurate in the context of temperature and process variations.

The techniques can be implemented with any types of memory transistors (or memory cells), any types of metal-oxide-silicon (MOS) transistors, e.g., n-channel and/or p-channel transistors, any types of bipolar junction transistors (BJTs), and any types of operational amplifiers. The techniques can be applied to different types of memory systems, e.g., two-dimensional (2D) memory systems or three-dimensional (3D) memory systems. The techniques can be applied to various memory types, such as SLC (single-level cell) devices, or MLC (multi-level cell) devices like 2-level cell devices or TLC (triple-level cell) devices. The techniques can be applied to various types of non-volatile memory devices, such as Static Random Access Memory (SRAM), Dynamic Random Access Memory (DRAM), flash memory such as NOR flash memory and/or NAND flash memory, resistive random-access memory (RRAM), magnetoresistive random-access memory (MRAM), phase-change random-access memory (PCRAM), among others. Additionally or alternatively, the techniques can be applied to various types of devices and systems, such as secure digital (SD) cards, embedded multimedia cards (eMMC), or solid-state drives (SSDs), embedded systems, among others.

The details of one or more disclosed implementations are set forth in the accompanying drawings and the description below. Other features, aspects, and advantages will become apparent from the description, the drawings and the claims.

BRIEF DESCRIPTION OF THE DRAWINGS

FIG. 7 is a flow chart of an example process for managing an integrated circuit in a memory device, according to one or more implementations of the present disclosure.

DETAILED DESCRIPTION

Figure 1A:
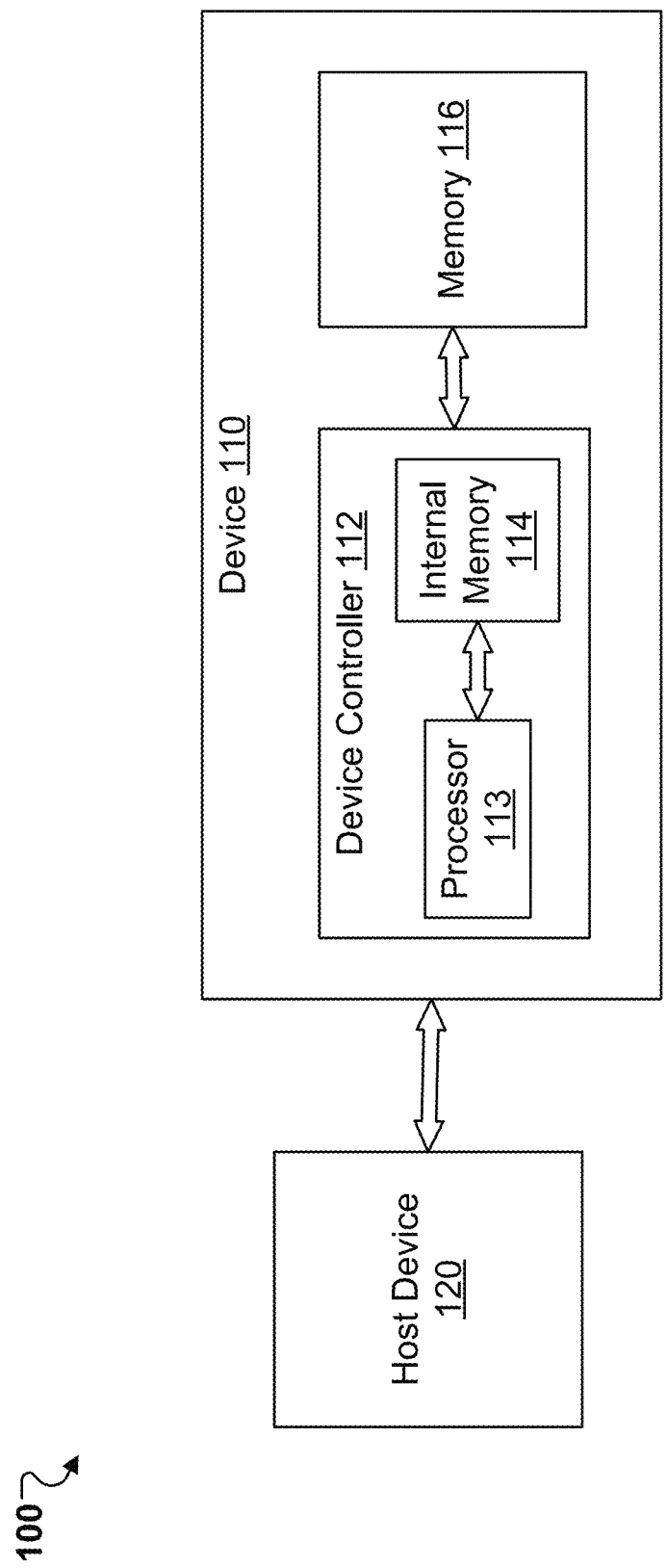
FIG. 1A illustrates an example of a system including a memory, according to one or more implementations of the present disclosure.

FIG. 1A illustrates an example of a system 100. The system 100 includes a device 110 and a host device 120. The device 110 includes a device controller 112 and a memory 116. The device controller 112 includes a processor 113 and an internal memory 114. In some implementations, the device 110 includes a plurality of memories 116 that are coupled to the device controller 112.

In some implementations, the device 110 is a storage device. For example, the device 110 can be an embedded multimedia card (eMMC), a secure digital (SD) card, a solid-state drive (SSD), or some other suitable storage. In some implementations, the device 110 is a smart watch, a digital camera or a media player. In some implementations, the device 110 is a client device that is coupled to a host device 120. For example, the device 110 is an SD card in a digital camera or a media player that is the host device 120.

The device controller 112 is a general-purpose microprocessor, or an application-specific microcontroller. In some implementations, the device controller 112 is a memory controller for the device 110. The following sections describe the various techniques based on implementations in which the device controller 112 is a memory controller. However, the techniques described in the following sections are also applicable in implementations in which the device controller 112 is another type of controller that is different from a memory controller.

The processor 113 is configured to execute instructions and process data. The instructions include firmware instructions and/or other program instructions that are stored as firmware code and/or other program code, respectively, in the secondary memory. The data includes program data corresponding to the firmware and/or other programs executed by the processor, among other suitable data. In some implementations, the processor 113 is a general-purpose microprocessor, or an application-specific microcontroller. The processor 113 is also referred to as a central processing unit (CPU).

The processor 113 accesses instructions and data from the internal memory 114. In some implementations, the internal memory 114 is a Static Random Access Memory (SRAM) or a Dynamic Random Access Memory (DRAM). For example, in some implementations, when the device 110 is an eMMC, an SD card or a smart watch, the internal memory 114 is an SRAM. In some implementations, when the device 110 is a digital camera or a media player, the internal memory 114 is DRAM.

In some implementations, the internal memory is a cache memory that is included in the device controller 112, as shown in FIG. 1A. The internal memory 114 stores instruction codes, which correspond to the instructions executed by the processor 113, and/or the data that are requested by the processor 113 during runtime.

The device controller 112 transfers the instruction code and/or the data from the memory 116 to the internal memory 114. The memory 116 can be a semiconductor device. In some implementations, the memory 116 is a non-volatile memory that is configured for long-term storage of instructions and/or data, e.g., a NAND flash memory device, or some other suitable non-volatile memory device. In implementations where the memory 116 is NAND flash memory, the device 110 is a flash memory device, e.g., a flash memory card, and the device controller 112 is a NAND flash controller. For example, in some implementations, when the device 110 is an eMMC or an SD card, the memory 116 is a NAND flash; in some implementations, when the device 110 is a digital camera, the memory 116 is an SD card; and in some implementations, when the device 110 is a media player, the memory 116 is a hard disk. In some implementations, the memory 116 is included in a personal electronic device such as a laptop or desktop computer, a smart phone, a smart watch, a digital camera, a wearable electronic device, or a media player.

The memory 116 includes a plurality of blocks. The memory 116 can be a two-dimensional (2D) memory including 2D memory blocks. The memory 116 can also be a three-dimensional (3D) memory including 3D memory blocks.

Figure 1B:
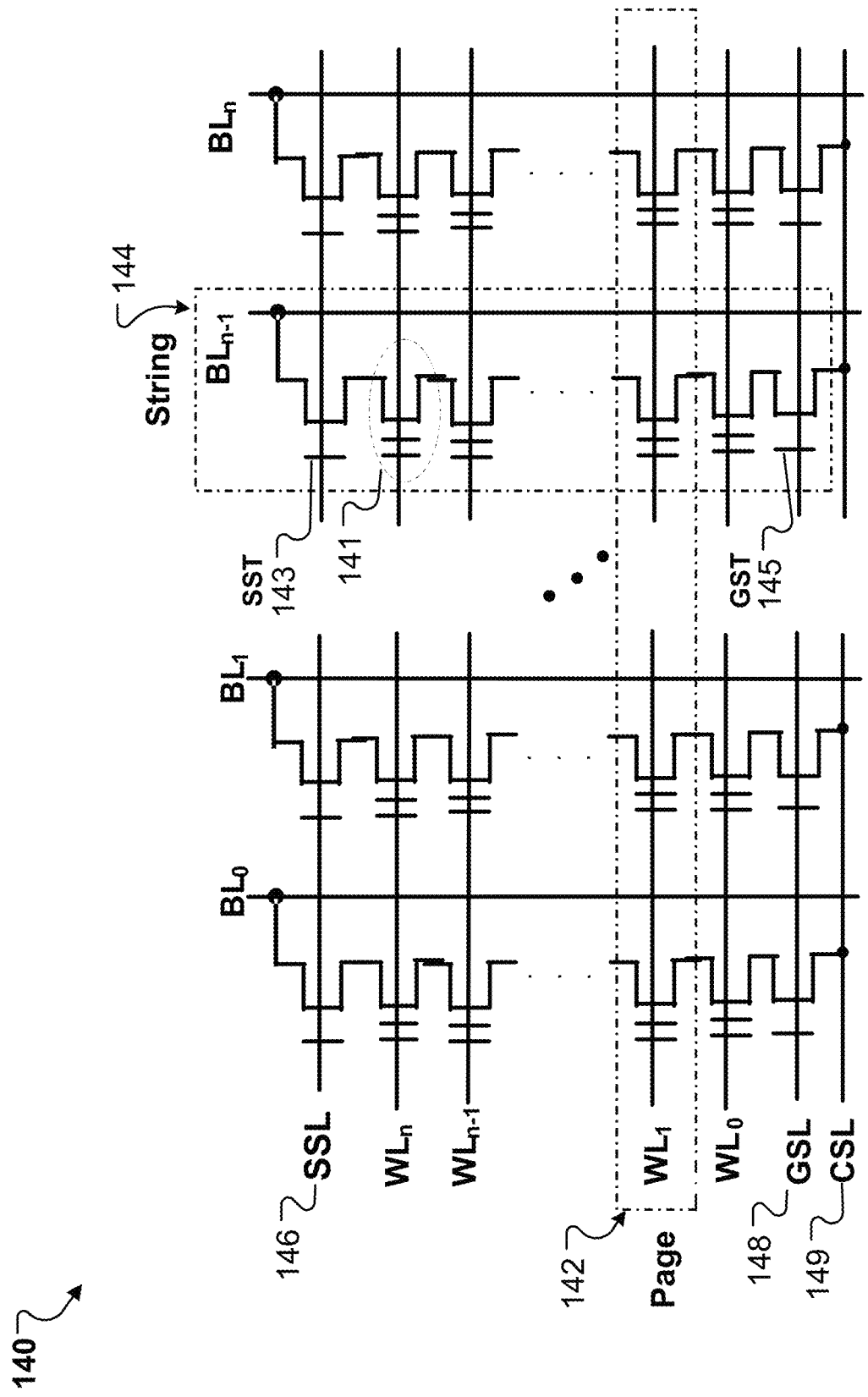
FIG. 1B illustrates an example of a block of a two-dimensional (2D) memory, according to one or more implementations of the present disclosure.

FIG. 1B illustrates an example configuration of a 2D memory block 140 of a memory, such as memory 116. The block 140 includes memory cells 141 coupled in series to column bit lines $BL_0$, $BL_1$, ..., $BL_{n-1}$, and $BL_n$ to form a number of cell strings 144, and to row word lines $WL_0$, $WL_1$, ..., $WL_{n-1}$, and $WL_n$ to form a number of cell pages 142.

Each memory cell in a block includes a transistor structure having a gate, a drain, a source, and a channel defined between the drain and the source. Each memory cell is located at an intersection between a word line and a bit line, where the gate is connected to the word line, the drain is connected to the bit line, and the source is connected to a source line, which in turn is connected to common ground. In some examples, the gate of a flash memory cell has a dual-gate structure, including a control gate and a floating gate, where the floating gate is suspended between two oxide layers to trap electrons that program the cell.

A cell string 144 can include a number of memory cells 141, a string select transistor (SST) 143, and a ground select transistor (GST) 145, which are all connected in series. A gate of the SST 143 is connected to a string select line (SSL) 146. Gates of the SSTs 143 in different strings are also connected to the same SSL. Gates of the memory cells 141 are respectively connected to word lines $WL_0$, $WL_1$, $WL_{n-1}$, $WL_n$. The cell strings 144 or the memory cells 141 are connected to a common source line (CSL) 149 via the GST 145. The CSL 149 can be coupled to a ground. A gate of the GST 145 is connected to a ground select line (GSL) 148. Gates of the GSTs 145 in different strings 144 are also connected to the same GSL 148.

A cell page 142 can include a number of memory cells 141. Gates of the memory cells 141 in the cell page 142 are coupled in series to a respective word line (WL). When an input voltage is applied to the word line, the input voltage is also applied to the gates of the memory cells 141 in the cell page 142. To read a particular cell page 142 in the block 140 in a read operation, a lower voltage is applied onto a word line corresponding to the particular cell page 142. Meanwhile, a higher voltage is applied onto the other cell pages in the block 140.

Figure 1C:
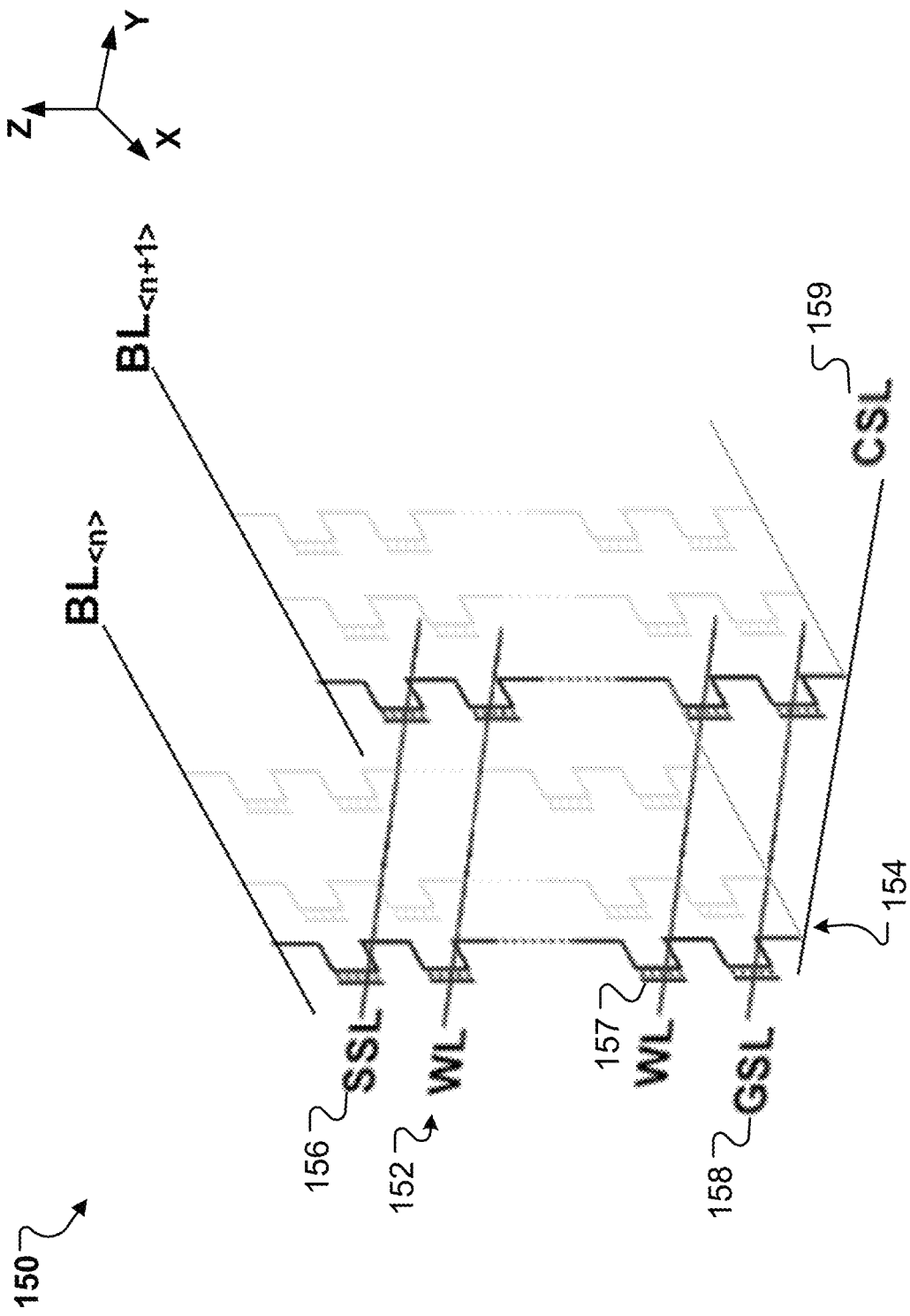
FIG. 1C illustrates an example of a block of a three-dimensional (3D) memory, according to one or more implementations of the present disclosure.

FIG. 1C illustrates an example 3D memory block 150 for implementation of a 3D memory. The 3D memory block 150 can be a stack of the 2D memory block 140 of FIG. 1B. Memory cells 157 are arranged in three dimensions, e.g., in an XYZ coordinate system, and coupled to a number of word lines to form a number of cell pages (conductive layers or word line layers) 152 and a number of bit lines to form a number of cell strings 154. A cell page 152 can be a layer, e.g., in the XY plane, and memory cells 157 on the same layer can be coupled to one word line and have a same voltage. Each cell page 152 can be connected to a respective contact pad in a driving circuit, e.g., X-decoder (or a scanning driver).

A cell string 154 includes a number of memory cells 157 connected in series vertically along the Z direction, where a memory cell can be configured as an SST coupled to a string select line (SSL) 156 and a memory cell can be configured as a GST coupled to a ground select line (GSL) 158. The cell strings 154 are connected to one or more drivers, e.g., data drivers. The cell strings 154 of the memory cells 157 are connected to a common source line (CSL) 159 via the ground select transistors (GSTs). The CSL 159 can be a conductive layer (or multiple conductive lines) formed on a substrate of the 3D memory. The CSL 159 can be coupled to the ground.

Figure 2:
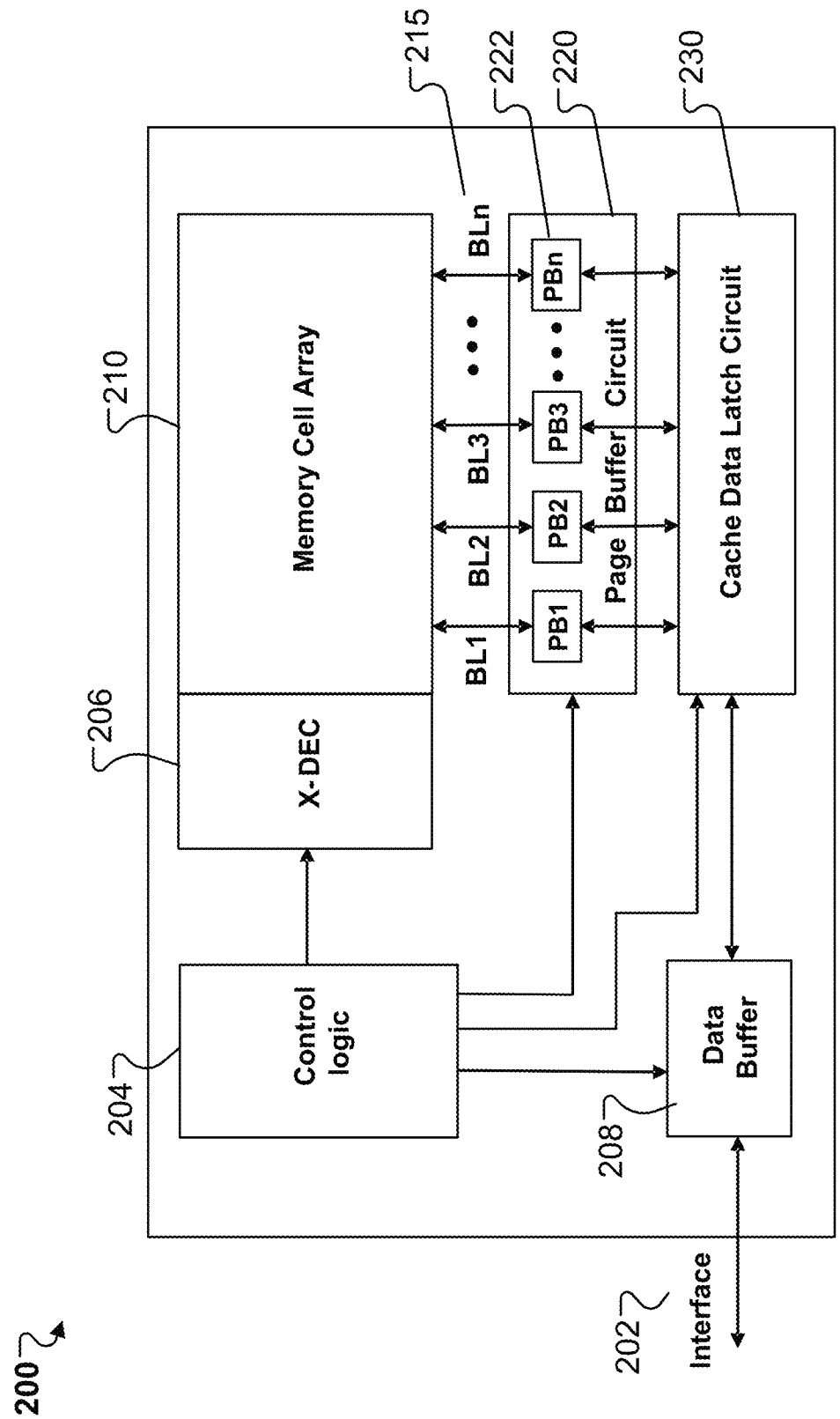
FIG. 2 illustrates an example of a memory device including a page buffer circuit having a number of page buffers, according to one or more implementations of the present disclosure.

FIG. 2 illustrates an example configuration of a memory device 200. The memory device 200 can be implemented as the memory 116 of FIG. 1A. The memory device 200 includes a memory cell array 210. The memory cell array 210 can include a number of memory cells, e.g., the memory cells 141 of FIG. 1B or 157 of FIG. 1C, coupled in series to a number of row word lines and a number of column bit lines.

A memory cell can include a memory transistor configured as a storage element. The memory transistor can include a silicon-oxide-nitride-oxide-silicon (SONOS) transistor, a floating gate transistor, a nitride read only memory (NROM) transistor, or any suitable non-volatile memory MOS device that can store charges.

The memory device 200 includes a memory interface 202 having multiple input/output (I/O) ports for receiving data, e.g., from a memory controller such as a device controller, or outputting data from the memory cell array 210. The memory device 200 includes a data buffer 208 configured to buffer data received and outputted through the memory interface 202.

The memory device 200 further includes an X-decoder (or row decoder) 206 and a Y-decoder (not shown). Each memory cell is coupled to the X-decoder 206 via a respective word line and coupled to the Y-decoder via a respective bit line 215 (BL1, BL2, . . . , BLn). Accordingly, each memory cell can be selected by the X-decoder 206 and the Y-decoder for read or write operations through the respective word line and the respective bit line 215.

The memory device 200 includes a page buffer circuit 220 that includes a number of page buffers 222. Each page buffer 222 (PB1, PB2, PB3, . . . , PBn) is connected to the memory cell array 210 through a respective bit line 215 (BL1, BL2, BL3, . . . , BLn). In some embodiments, a page buffer 222 is connected to the Y-decoder through a data line associated with a corresponding bit line 215 that connects a corresponding line of memory cells in the memory cell array 210. A page buffer is configured to control a voltage on a corresponding bit line to perform an operation, e.g., read, program, or erase, on a memory cell coupled to the corresponding bit line.

In some embodiments, the memory device 200 further includes a cache data latch (CDL) circuit 230 coupled between the page buffer circuit 220 and the data buffer 208. During a program or erase operation, the CDL circuit 230 is configured to store data from the data buffer 208 and/or output to one or more page buffers 222 in the page buffer circuit 220. During a read operation, the CDL circuit 230 is configured to store data from one or more page buffers 222 in the page buffer circuit 220 and/or output data to the data buffer 208.

The memory device 200 further includes a control logic 204 coupled to components in the memory device 200 including the X-decoder 206 and the Y-decoder, the data buffer 208, the page buffer circuit 220, and the CDL circuit 230. The control logic 204 is configured to receive a command, address information, and/or data, e.g., from a memory controller, via the memory interface 202. The control logic 204 can also process the command, the address information, and/or the data, for example, to generate physical address information, e.g., of blocks/pages, in the memory cell array 210.

In some implementations, the control logic 204 includes a data register, an SRAM buffer, an address generator, a mode logic, and a state machine. The mode logic can be configured to determine whether there is a read or write operation and provide a result of the determination to the state machine.

During a write operation, the data register in the control logic 204 can register input data from the interface 202, and the address generator in the control logic 204 can generate corresponding physical addresses to store the input data in specified memory cells of the memory cell array 210. The address generator can be connected the X-decoder 206 and the Y-decoder that are controlled to select the specified memory cells through corresponding word lines and bit lines. The SRAM buffer can retain the input data from the data register in its memory as long as power is being supplied. The state machine can process a write signal from the SRAM buffer and provide a control signal to a voltage generator that can provide a write voltage to the X-decoder 206 and/or the Y-decoder. The Y-decoder is configured to output the write voltage to the bit lines (BLs) for storing the input data in the specified memory cells.

During a read operation, the state machine can provide control signals to the voltage generator and the page buffer circuit 220. The voltage generator can provide a read voltage to the X-decoder 206 and the Y-decoder for selecting a memory cell. A page buffer 222 can sense a small power signal (e.g., a current signal) that represents a data bit ("1" or "0") stored in the selected memory cell through a bit line 215 coupled to the page buffer 222 and the selected memory cell. A sense amplifier can amplify the small power signal swing to recognizable logic levels so the data bit can be interpreted properly by logic inside or outside the memory device 200. In some implementations, the page buffer circuit 220 and/or the CDL circuit 230 are included in the sense amplifier. The data buffer 208 can receive the amplified voltage from the sensor amplifier and output the amplified power signal to the logic outside the memory device 200 through the memory interface 202.

To sense data stored in a memory cell, in a discharging phase of operation, stored charge at a sensing node is discharged as current through a bit line of the memory cell. An amount of discharged charge, which sets a discharged sensing voltage $V_{SEN}$ at the sensing node, depends on a state (a bit "0" or a bit "1") of the memory cell. During a subsequent sensing phase (or strobing phase) of operation, if the memory cell stores a bit "0," the discharged sensing voltage $V_{SEN}$ at the sensing node can be greater than a threshold voltage, e.g., a strobe voltage $V_{strobe}$ that is associated with latches in the page buffer. In some implementations, the strobe voltage $V_{strobe}$ is identical to a threshold voltage $V_{TH}$ of a sensing transistor coupled to the sensing node. Accordingly, the page buffer can be configured to update a bit value "1" latched in the one or more latches to a sensed value "0," or to strobe the sensed value "0" to the one or more latches. In contrast, if the memory cell stores a bit "1", the discharged sensing voltage $V_{SEN}$ at the sensing node can be smaller than or equal to the strobe voltage. Accordingly, the page buffer can be configured to maintain (or keep) the bit value "1" latched in the one or more latches. The discharged sensing voltage $V_{SEN}$ can be tested by testing whether the sensing transistor is turned (or switched) on or off, such that the strobe voltage $V_{strobe}$ and the threshold voltage $V_{TH}$ of the sensing transistor are identical in the absence of compensation, e.g., in some cases when a source of the sensing transistor is grounded.

If the threshold voltage $V_{TH}$ of the sensing transistor is different from an expected value, the strobe voltage may change and the sensing result may be wrong. For example, a sensing voltage $V_{SEN}$ corresponding to a stored bit "1," which is less than an ideal/expected value of $V_{TH}$, may be greater than an actual, non-ideal value of $V_{TH}$, such that a stored bit "0" is incorrectly sensed. Or, a sensing voltage $V_{SEN}$ corresponding to a stored bit "0," which is greater than the ideal/expected value of $V_{TH}$, may be less than the actual, non-ideal value of $V_{TH}$, such that a stored bit "1" is incorrectly sensed.

Variation in $V_{TH}$ of the sensing transistor can be caused, for example, by variations in temperature, by process variations in fabrication of the sensing transistor, or by a combination of these factors. "Process, voltage, and temperature" (PVT) variation refers to variation in one or more of the fabrication process, voltages (e.g., operating voltages or supply voltages), or temperature that can together affect $V_{TH}$. For example, a threshold voltage variation in complementary metal-oxide-semiconductor (CMOS) transistors can be between −4 mV/K and −2 mV/K, such that over a typical target temperature operating range of 150° C. the threshold voltage can vary by 300 mV to 600 mV, a significant difference. Threshold voltage can also vary with gate length, doping levels/profiles, and other parameters that may change unpredictably based on process variations.

Implementations of the present disclosure provide integrated circuits, such as page buffer circuits, with process and temperature compensation. In the case of an n-channel sensing transistor, a source voltage of the sensing transistor is adjusted to compensate for the $V_{TH}$ variation. With compensation, the strobe voltage of the sensing transistor is maintained constant, and a large, constant sensing swing can be achieved. Memory cell states can then be correctly sensed during the sensing phase of operation.

Figure 3:
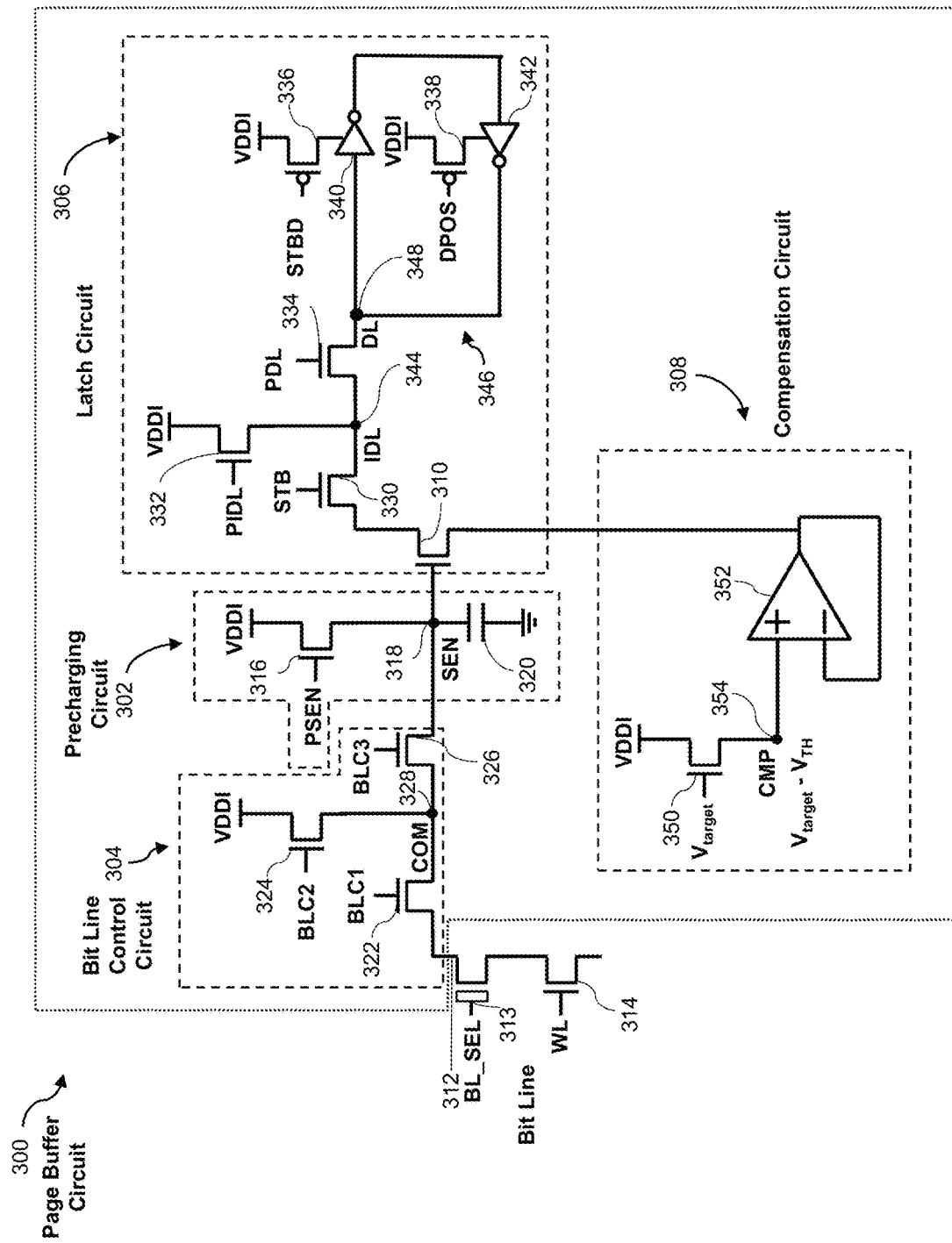
FIG. 3 illustrates an example of a page buffer circuit, according to one or more implementations of the present disclosure.

FIG. 3 illustrates a page buffer circuit 300 (e.g., implementing a page buffer 222) including a compensation circuit. In some implementations, the page buffer circuit 300 includes a precharging circuit 302, a bit line control circuit 304, a latch circuit 306, and a compensation circuit 308. The page buffer circuit 300 is coupled to a bit line 312 coupled to a bit line transistor 313 and a memory cell 314 whose state is measurable by the page buffer circuit 300. The bit line 312 can be included in a cell string such as cell string 144 or cell string 154. As described in more detail below, the latch circuit 306 includes a sensing transistor 310, variations of the threshold voltage of which can be compensated for by the compensation circuit 308.

In some implementations, the precharging circuit 302 includes an n-channel transistor 316 (e.g., an NMOS transistor) coupled between a supply voltage VDDI and a sensing node 318. The transistor 316 has a drain terminal for receiving the supply voltage VDDI, a gate terminal for receiving a precharging enable signal PSEN, and a source terminal coupled to the sensing node 318. The precharging circuit 302 also includes a capacitor 320 coupled between the sensing node 318 and ground. The capacitor 320 can be implemented in various ways, e.g., as a metal-oxide-metal (MOM) capacitor or as a metal-oxide-semiconductor (MOS) capacitor, such as a capacitor integrated into a transistor. The transistor 316 can be switched on/off by the precharging enable signal PSEN to allow charging/discharging of the capacitor 320.

In some implementations, the bit line control circuit 304 includes three n-channel transistors 322, 324, and 326 for receiving respective bit line control signals BLC1, BLC2, and BLC3. Transistor 326 has a drain terminal coupled to the sensing node 318 and a source terminal coupled to a common node 328; accordingly, transistor 326 can be switched on/off to couple/decouple the bit line 312 and other portions of the bit line control circuit 304 from other portions of the page buffer circuit 300. Transistor 324 has a drain terminal for receiving the supply voltage VDDI and a source terminal coupled to the common node 328, such that transistor 324 can be switched on/off to allow charging/discharging of memory cells of the bit line 312. Transistor 322 has a drain terminal coupled to the common node 328 and a source terminal coupled to the bit line 312, such that the transistor 322 can be switched on/off to couple/decouple the page buffer circuit 300 from the bit line 312.

In some implementations, the latch circuit 306 includes three n-channel transistors 330, 332, and 334; two p-channel transistors (e.g., PMOS transistors) 336 and 338; and two inverters 340 and 342. Inverter 340 is configured to receive a corresponding signal DPOS, and inverter 342 is configured to receive a corresponding standby signal STBD. The p-channel transistors 336 and 338 and the inverters 340 and 342 in combination form a tri-state latch unit 346 (sometime referred to as a "latch") that can take on "0" or "1" states based on reading out memory cells of the bit line 312. In some implementations, the latch circuit 306 includes a sensing latch circuit, a storage latch circuit, and/or another type of latch circuit. In various implementations, different types of latch units can be included in the latch circuit. For example, fighting latches, or any suitable latches, can be included. In addition, page buffers for different types of memory cells can have different numbers of latch units in each latch circuit. For example, if the memory cell type of a memory cell is single-level cell (SLC), the page buffer for the memory cell can include 2 latch units; if the memory cell type of a memory cell is multi-level cell (MLC), the page buffer can include 3 latch units; if the memory cell type of a memory cell is triple-level cell (TLC), the page buffer can include 5 latch units; if the memory cell type of a memory cell is penta-level cell (PLC,) the page buffer can include 6 latch units.

Transistor 330 includes a source terminal coupled to a drain terminal of sensing transistor 310, a gate terminal for receiving a strobe control signal STB, and a drain terminal coupled to an IDL node 344 (e.g., a node associated with initial storage of data). Accordingly, transistor 330 can be switched on/off to couple/decouple the sensing transistor 310 from other portions of the latch circuit 306. Transistor 332 includes a drain terminal for receiving the supply voltage VDDI, a gate terminal for receiving an IDL control signal PIDL, and a source terminal coupled to the IDL node 344. Accordingly, transistor 332 can be switched on/off to charge/discharge the IDL node 344, such as to charge/discharge junction capacitances and/or metal capacitances associated with the IDL node 344. Transistor 334 includes a drain terminal coupled to a DL node 348, a gate terminal for receiving a data latch control signal PDL, and a source terminal coupled to IDL node 344. Accordingly, transistor 334 can be switched on/off to couple/decouple the latch unit 346 from other portions of the page buffer circuit 300.

In some implementations, the compensation circuit 308 includes an n-channel compensation transistor 350 having substantially the same characteristics as the sensing transistor 310, and an operational amplifier (op-amp) 352. The compensation transistor 350 has a drain terminal for receiving the supply voltage VDDI, a gate terminal for receiving a voltage $V_{target}$ (described in more detail below), and a source terminal coupled to a positive input of the op-amp 352 at a compensation node 354. The voltage $V_{target}$ is a constant (e.g., predetermined) voltage that is independent from temperature and/or process variations or PVT-related effects. The voltage $V_{target}$ can be provided by a bandgap voltage circuit, such as a bandgap voltage circuit in a memory device, e.g., the memory device 200 of FIG. 2. For an n-channel compensation transistor 350, $V_{target}$ is configured to be larger than the threshold voltage $V_{TH}$ of the compensation transistor 350, such that the compensation node 354 has a voltage $V_{target}-V_{TH}$. The op-amp 352 is configured as a voltage follower (buffer circuit) such that an identical voltage $V_{target}-V_{TH}$ is supplied as a control voltage to the source terminal of the sensing transistor 310. As described in more detail below, the voltage $V_{target}-V_{TH}$ can compensate for variations in the threshold voltage $V_{TH}$ of the sensing transistor 310.

The compensation transistor 350 "matches" the sensing transistor 310 at least in that variations in the threshold voltage of the compensation transistor 350 match (e.g., are substantially identical to) variations in the threshold voltage of the sensing transistor 310. For example, in some implementations, a temperature dependence of the threshold voltage of the compensation transistor 350 matches a temperature dependence of the threshold voltage of the sensing transistor 310. In some implementations the compensation transistor 350 and the sensing transistor 310 have matching transistor designs, e.g., gate length, oxide material and thickness, doping levels, channel type, and/or other materials and/or dimensions, so as to having matching threshold voltages. In some implementations, the compensation transistor 350 and the sensing transistor 310 are fabricated with a same manufacturing condition, e.g., at a common temperature, and/or in a common process, e.g., a common lithography process, such that process variations (and threshold voltage variations stemming therefrom) in one transistor are reflected in the other transistor. In some implementation, the use of the matching compensation transistor 350 can provide a $V_{TH}$-tracking solution that is more efficient than at least some other solutions, e.g., requires fewer devices and/or less complex circuitry to implement.

Figure 4A:
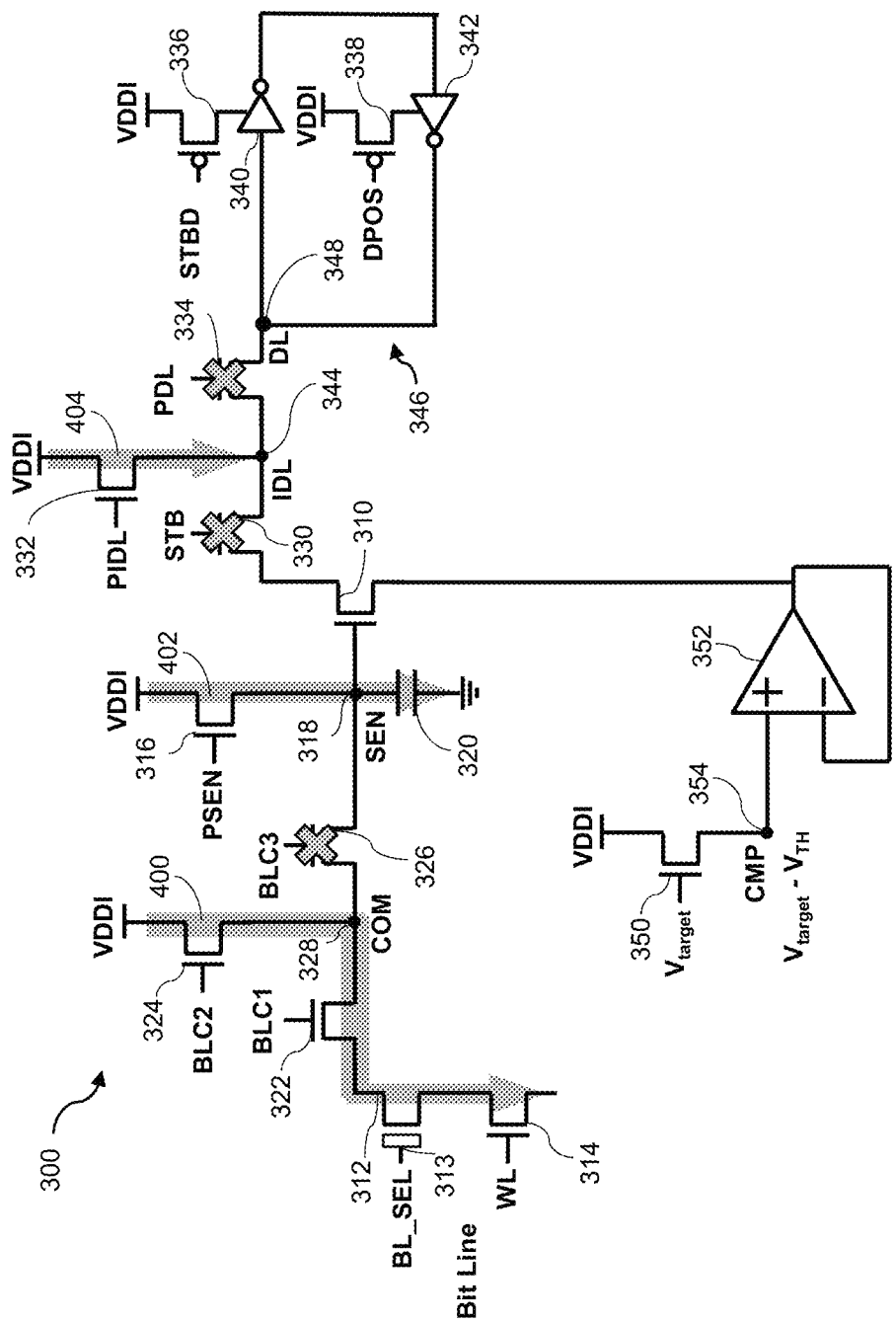
FIGS. 4A-4C illustrate phases of operations of an example of a page buffer circuit, according to one or more implementations of the present disclosure.
Figure 4B:
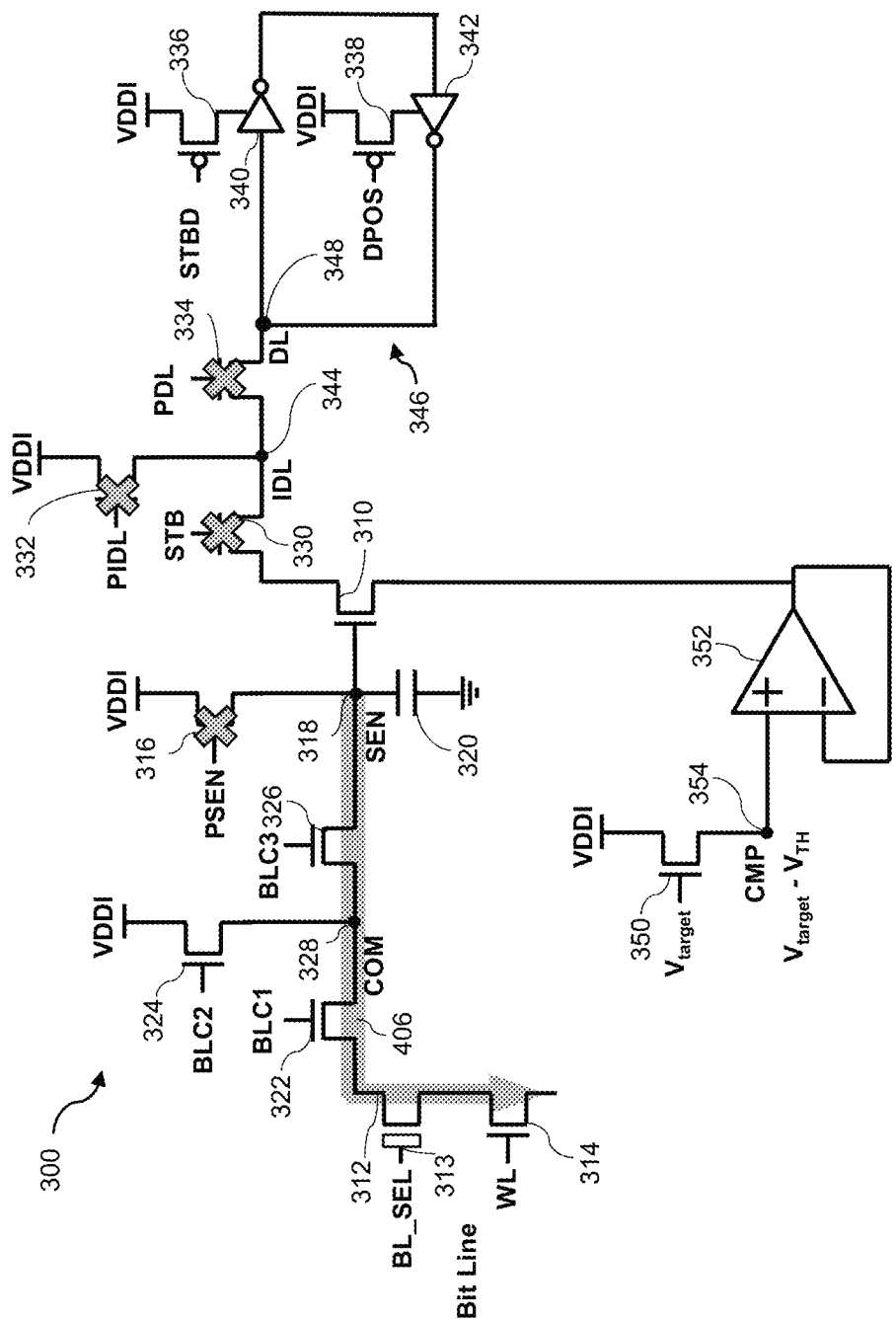
Figure 4C:
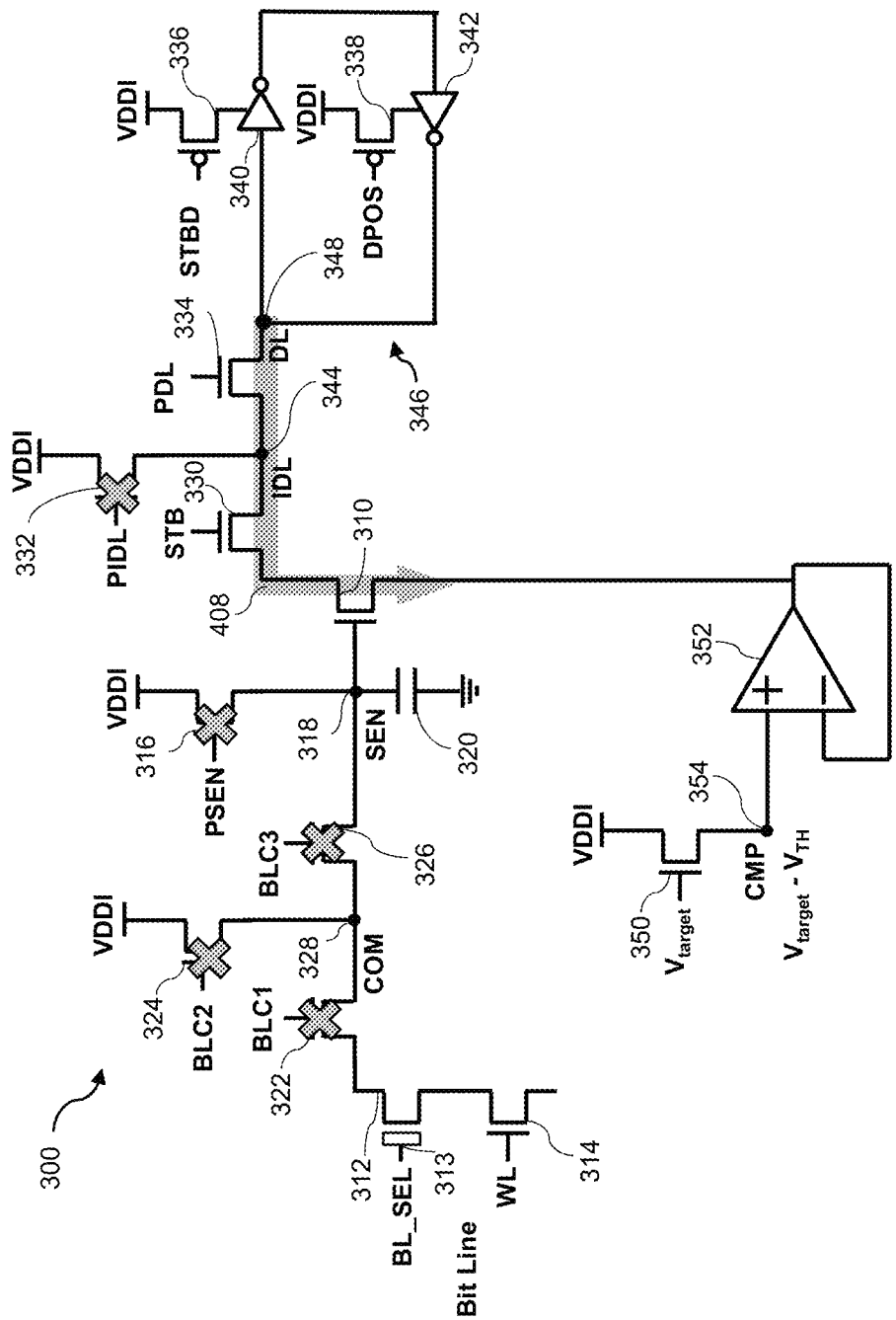
Figure 5:
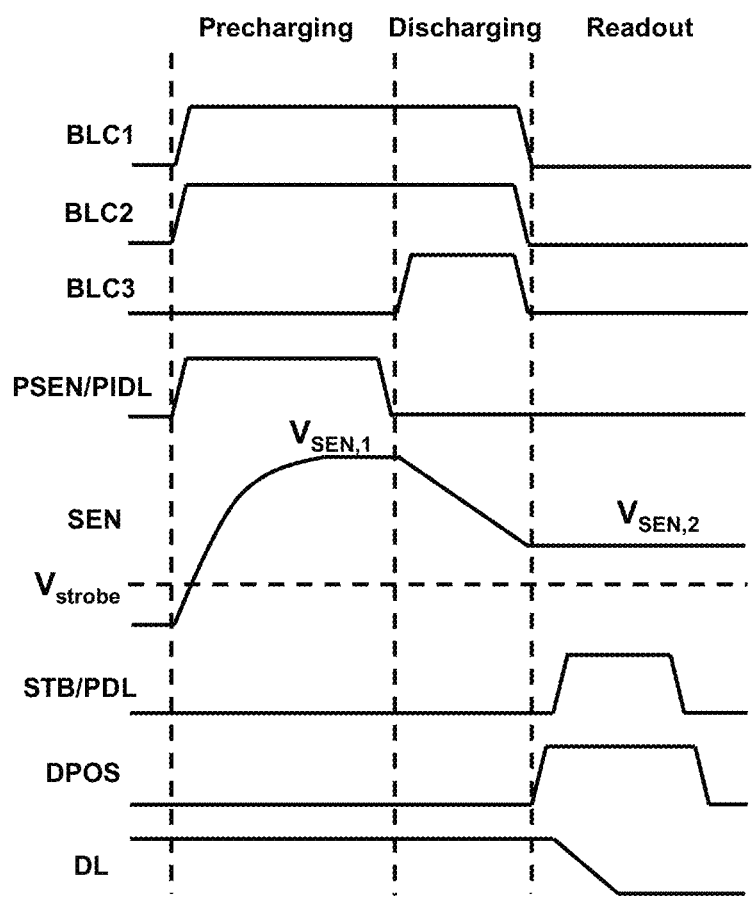
FIG. 5 shows a timing diagram illustrating control signals during phases of operation of an example of a page buffer circuit, according to one or more implementations of the present disclosure.

FIGS. 4A-4C illustrate phases of operation of the page buffer circuit 300. Corresponding control voltages are shown in FIG. 5.

As shown in FIG. 4A, in a precharging phase, transistors 322 and 324 are turned on using BLC1 and BLC2 to charge the bit line 312 by current 400. This process elevates a voltage of the common node 328 to a value $V_{COM}$. Transistor 326 is turned off using BLC3 to isolate the bit line 312 from the latch circuit 306. Transistor 316 is turned on using PSEN to charge capacitor 320 by current 402, elevating a sensing voltage at the sensing node 318 to $V_{SEN,1}$. In some examples, $V_{SEN,1}$ is identical to the supply voltage VDDI. Transistor 332 is turned on using PIDL to charge the IDL node 344 by current 404. Transistors 330 and 334 are turned off using STB and PDL to isolate the IDL node 344 from the sensing transistor 310 and from the latch unit 346.

As shown in FIG. 4B, during a discharging phase, transistor 326 is turned on using BLC3, while transistor 316 is turned off using PSEN. This conductively couples the sensing node 318 with the bit line 312, allowing a current 406 to flow from the sensing node 318 (e.g., from the charged capacitor 320), to the bit line 312, and to memory cell 314, which discharges a sensing voltage at the sensing node 318 from $V_{SEN,1}$ to a lower voltage $V_{SEN,2}$. Transistors 330, 332, and 334 are turned off using STB, PIDL, and DL to retain charge (voltage) on the IDL node 344.

A total amount of charge that flows as current 406 depends on a state of the memory cell 314. Specifically, in some implementations, when memory cell 314 stores bit "1," a larger amount of charge will flow as current 406, and, when memory cell 314 stores bit "0," a smaller amount of charge will flow as current 406 (other implementations can operate in an opposite manner). A larger amount of flowing charge corresponding to a larger decrease in the sensing voltage $V_{SEN}$ from $V_{SEN,1}$ to $V_{SEN,2}$. Accordingly, $V_{SEN,2}$ when the memory cell 314 stores bit "1" is lower than $V_{SEN,2}$ when the memory cell 314 stores bit "0."

The value of $V_{SEN,2}$ dictates a state of the sensing transistor 310. When the sensing transistor 310 is an n-channel transistor, the sensing transistor 310 is turned on when $V_{GS}$ (the difference between the gate terminal voltage and the source terminal voltage of the transistor) is greater than the threshold voltage $V_{TH}$. The gate terminal voltage at the conclusion of the discharging phase is $V_{SEN,2}$. Accordingly, when the memory cell 314 stores bit "1," the sensing transistor 310 can be off at the conclusion of the discharging phase, e.g., $V_{SEN,2}$ can be low enough to cause $V_{GS}$ to be less than or equal to $V_{TH}$. Correspondingly, when the memory cell 314 stores bit "0," the sensing transistor 310 can be on at the conclusion of the discharging phase, e.g., $V_{SEN,2}$ can be high enough to cause $V_{GS}$ to be higher than $V_{TH}$. As shown in FIG. 5, in this example, $V_{SEN,2}$ is higher than $V_{strobe}$ (which, in the absence of compensation, can be identical to $V_{TH}$) at the conclusion of the discharging phase. The on/off state of the sensing transistor 310 is read (determined) during a subsequent readout phase and transferred to the latch unit 346. However, in the absence of compensation (provided in this example by the compensation circuit 308, as described in more detail below), a reliable correspondence between "1"/"0" states of the memory cell 314 and off/on states of the sensing transistor 310 relies on $V_{TH}$ being stable.

As shown in FIG. 4C, during the readout phase, transistors 322, 324, and 326, are switched off using BLC1, BLC2, and BLC3, to isolate the sensing node 318 from couplings besides the gate terminal of the sensing transistor 310 and the capacitor 320. Transistor 332 is turned off using PIDL, while transistors 330 and 334 are turned on using STB and PDL. Accordingly, if the sensing transistor 310 is on, a current 408 can flow from the DL node 348 and through the sensing transistor 310, and a high voltage corresponding to a bit value "1" at the DL node 348 is charged to a low voltage corresponding to the bit value "0," storing/sensing the bit value "0" in the latch unit 346. If the sensing transistor 310 is off, the current 408 does not flow, and the high voltage at the DL node 348 is retained to store/sense the bit value "1" in the latch unit 346.

As noted above, the compensation circuit 308, by providing a control voltage to the source terminal of the sensing transistor 310, compensates for variations in the threshold voltage $V_{TH}$ of the sensing transistor 310. This operation can be understood by deriving the turn-on condition of the sensing transistor 310 in two cases: in the absence of the compensation circuit 308 (with the source terminal of the sensing transistor 310 grounded), and with the control voltage $V_{control}=V_{target}-V_{TH}$ provided to the source terminal by the compensation circuit 308.

In the absence of the compensation circuit 308 (for example, if the source terminal of the sensing transistor 310 is grounded), the strobe voltage $V_{strobe}$ is identical to $V_{TH}$, and the sensing transistor 310 is turned on when $V_{SEN,2}>V_{TH}$. The turn-on condition depends directly on $V_{TH}$, and variations in $V_{TH}$ can cause the sensing transistor 310 to be turned on/off incorrectly. For example, in an example situation in which $V_{SEN,2}=V_{TH}$ 0.05 V at a first temperature, the transistor will be on (e.g., "correctly" on, reflecting a bit value of the memory cell 314) at the first temperature. However, if temperature variations cause the threshold voltage at a second temperature to have a value of $V_{TH}'=V_{TH}-0.10$ V, then, at the second temperature, $V_{SEN,2}=V_{TH}'-0.05V$, and the sensing transistor 310 will be turned off "incorrectly."

However, in the example page buffer circuit 300, a threshold voltage-dependent control voltage $V_{target}-V_{TH}$ is applied at the source terminal of the sensing transistor 310, which is turned on when $V_{GS}>V_{TH}$. This condition is equivalent to $V_{SEN,2}-V_{source}>V_{TH}$, which is equivalent to $V_{SEN,2}-V_{target}+V_{TH}>V_{TH}$, which reduces to the condition $V_{SEN,2}>V_{target}$. Accordingly, rather than the strobe voltage $V_{strobe}$ being identical to the sensing transistor threshold voltage $V_{TH}$, which may vary due to temperature effects, process effects, and other effects, the strobe voltage $V_{strobe}$ is $V_{target}$, which is a constant voltage that is independent from temperature and/or process variations or PVT-related effects. The V-dependence of the turn-on condition is removed and replaced by a stable condition dependent on $V_{target}$, which can be directly selected and applied to the gate terminal of compensation transistor 350 in the compensation circuit 308. Therefore, by coupling a terminal of the sensing transistor 310, such as the source terminal, to a control voltage instead of ground, states of the memory cell 314 are correctly sensed by the sensing transistor 310 even when $V_{TH}$ may vary due to temperature effects and process variations. In some implementations, the turn-on condition is caused to be independent of or less dependent on $V_{TH}$ variation over a predetermined temperature range, such as −40° C. to 125° C. or another temperature range. $V_{target}$ can be referred to as a "target" voltage because it represents a compensated target voltage for on/off switching of the sensing transistor.

The target voltage $V_{target}$ can be configured (e.g., selected and applied at the gate terminal of the compensation transistor 350) based on one or more of various conditions. In some implementations, $V_{target}$ is configured to be always larger (or essentially/nearly always larger) than $V_{TH}$ for a predetermined range of process and temperature variations, e.g., $V_{target}$ can be empirically determined. For example, to determine $V_{target}$, measurements can be taken to determine $V_{TH}$ in many sensing transistors (reflecting process variations) over a desired temperature range. $V_{target}$ can then be selected to be larger than any of these measured $V_{TH}$, or selected based on a statistical analysis of these measured $V_{TH}$, such as to be larger than a 99th percentile $V_{TH}$ value. In some examples, the measured $V_{TH}$ varies in a range defined between a higher threshold voltage $V_{TH-H}$ and a lower bound voltage $V_{TH-L}$. The target voltage can be set to be identical to $V_{TH-H}$. Accordingly, in practice, $V_{target}$ can essentially always be larger than $V_{TH}$, to achieve correct operation of the compensation circuit 308 as described in this disclosure.

In some implementations, $V_{target}$ can instead or additionally satisfy a condition that $V_{target}$ is greater than or equal to $V_{COM}$, the voltage at the common node 328 at the end of the precharging phase. When this condition is satisfied, the sensing voltage at the sensing node 318 can be swung to $V_{target}$ while maintaining discharge of the sensing voltage to generate a current during the discharging phase to flow from the sensing node 318 to the common node 328, in line with desired operation of the page buffer circuit 300. For example, in some implementations VDDI is about 1.4 V and $V_{COM}$ is about 0.7 V. In such an example, $V_{SEN}$ precharges to 1.4 V and, if cell current is high, discharges to 0.8 V, causing the sensing transistor 310 to be off. In some implementations, $V_{COM}$ is equal or approximately equal to 0.7 V.

Figure 6A:
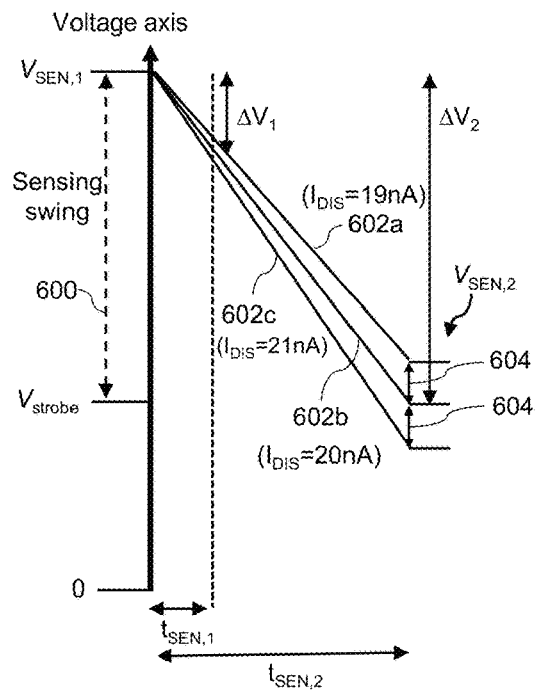
FIG. 6A shows a voltage diagram illustrating sensing voltages of a page buffer circuit relative to a strobe voltage.

Another advantage provided by this compensation scheme is a relatively large and stable "sensing swing," meaning a voltage swing at the sensing node 318 necessary to turn off the sensing transistor 310. As shown in FIG. 6A, in general, the sensing swing 600 is equal to a difference between a first sensing voltage $V_{SEN,1}$ and $V_{strobe}$: a final voltage $V_{SEN,2}$ higher than $V_{strobe}$ causes the sensing transistor to be on, while a final voltage $V_{SEN,2}$ lower than $V_{strobe}$ causes the sensing transistor to be off. Discharge of the sensing node 318 occurs during a sensing time $t_{SEN}$ through a discharge current $I_{DIS}$. FIG. 6A shows three sensing voltage profiles 602a, 602b, and 602c corresponding to three examples of values of the discharge current: 19 nA, 20 nA, and 21 nA, respectively. When $V_{strobe}$ has the value shown in FIG. 6A, corresponding to sensing swing $\Delta V_2$ and approximate sensing time $t_{SEN,2}$, margins 604 between final voltages $V_{SEN,2}$ with the different current values are relatively large. The margins 604 represent allowed variation in electrical characteristics to produce a correct sensing result relative to $V_{strobe}$; accordingly, larger margins 604 represent higher tolerance of the circuit for different types of variation, such as process variation, temperature variation, and operational variation (e.g., variations in the supply voltage). These variations may be (but need not be) distinct from variations in the threshold voltage of the sensing transistor. For example, these variations can cause other circuit parameters of the circuit to be different.

In contrast to the relatively large margins 604 associated with sensing swing $\Delta V_2$, when the sensing swing is smaller (shown in FIG. 6A as sensing swing $\Delta V_1$ and approximate sensing time $t_{SEN,1}$), margins between final voltages of the sensing voltage profiles 602a, 602b, and 602c are smaller. These margins can be seen at time $t_{SEN,1}$ as spacings between the sensing voltage profiles 602a, 602b, and 602c, and correspond to less tolerance for variations in electrical characteristics. For example, when the sensing swing is smaller, smaller variations in the electrical characteristics (e.g., the discharge current $I_{DIS}$) can result in incorrect sensing results when $V_{SEN,2}$ is incorrectly above or below the strobe voltage $V_{strobe}$. For this reason, in some cases, a larger sensing swing is preferable to a smaller sensing swing, for reasons distinct from the reasons for which a stable sensing swing is desirable.

Figure 6B:
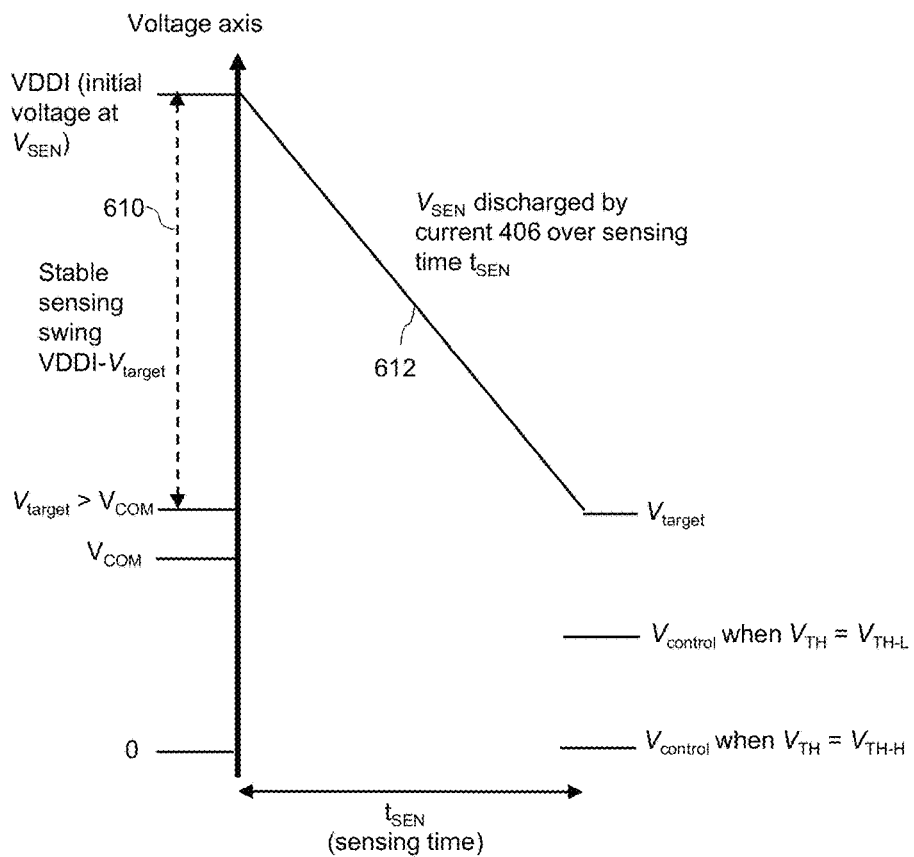
FIG. 6B shows a voltage diagram illustrating sensing voltages of an example of a page buffer circuit, according to one or more implementations of the present disclosure.

As shown in FIG. 6B, in the example page buffer circuit 300 including the compensation circuit 308, the sensing swing 610 is a range between a precharged voltage at the sensing transistor (e.g., the supply voltage VDDI) and the target voltage $V_{target}$, e.g., VDDI–$V_{target}$. During the sensing time $t_{SEN}$, the sensing voltage discharges from VDDI to another value $V_{SEN,2}$; in FIG. 6B, the discharge is shown as curve 612, and $V_{SEN,2}$ is equal to $V_{target}$. In line with the $V_{COM}$ condition noted above, $V_{target}$>$V_{COM}$. Because, in some implementations, $V_{target}$ is limited only by the $V_{COM}$ condition noted above, the sensing swing can be relatively large, e.g., up to VDDI–$V_{COM}$. This improves tolerance for electrical characteristic variation in the page buffer circuit 300. Also, as the supply voltage VDDI and the target voltage $V_{target}$ are both constant voltages, independent from $V_{TH}$ variations, the sensing swing 610 itself is also stable, independent from the $V_{TH}$ variations. The large and stable sensing swing can make the page buffer circuit 300 operate more reliably in the face of variations in $V_{TH}$ and variations besides $V_{TH}$ variations, compared to a circuit that does not include a compensating control voltage applied to the sensing transistor 310.

FIG. 6B also shows variations in the control voltage $V_{control}$ applied at the source of the sensing transistor 310 by the compensation circuit 308. In some implementations, $V_{target}$ is selected to be the high end $V_{TH-H}$ of $V_{TH}$ variation. Accordingly, when $V_{TH}$=$V_{TH-H}$, the control voltage is set the control voltage's lowest value of about 0 V or higher, which maintains desired operation of the page buffer circuit 300 (e.g., maintains the source terminal of the sensing transistor 310 at or above 0 V). When $V_{TH}$=$V_{TH-L}$, the control voltage is set to the control voltage's higher value of $V_{target}$–$V_{TH-L}$, which also maintains desired operation of the page buffer circuit 300 (e.g., in some implementations, maintains $V_{GS}$ of the sensing transistor 310 positive).

The advantages discussed in this disclosure compared to circuits without a control voltage applied to a sensing transistor can also apply compared to circuits that adjust a precharging sensing voltage $V_{SEN,1}$ at the sensing node to attempt to compensate for $V_{TH}$ variations. Compared to circuits that include adjustment of $V_{SEN,1}$ without a control voltage applied to the sensing transistor, the circuits described herein can feature improved characteristics, such as more stable switching conditions (e.g., more stable $V_{strobe}$), and larger, more stable swing voltages to provide larger voltage margins at the conclusion of the discharging phase.

The control voltage $V_{target}$–$V_{TH}$ provided in the page buffer circuit 300 is a non-limiting example. In some implementations, the control voltage is a function of $V_{TH}$ but is different from $V_{target}$–$V_{TH}$. For example, in some implementations the control voltage is a function of $V_{TH}$ such that a higher $V_{TH}$ results in a lower control voltage and a lower $V_{TH}$ results in a higher control voltage. In some implementations the control voltage is a function of temperature such that a higher temperature results in a higher control voltage, and a lower temperature results in a lower control voltage, in accordance with the negative temperature dependence of MOS threshold voltages. In some implementations, the control voltage compensates for variations in $V_{TH}$ such that a $V_{TH}$-dependence of the switching condition of the sensing transistor is decreased. In the example provided above, the $V_{TH}$-dependence is eliminated; in other implementations, the $V_{TH}$-dependence can be decreased without being eliminated, e.g., to decrease a coefficient of a $V_{TH}$ term of the threshold condition compared to a case where the compensation circuit is removed (e.g., replaced by a ground connection). In some implementations, the control voltage causes $V_{TH}$ variations to be compensated for (e.g., to not alter an on/off state of the sensing transistor for a given gate terminal voltage) over a predetermined $V_{TH}$ range, such as over a range of 0.01 V, over a range of 0.02 V, over a range of 0.05 V, over a range of 0.1 V, or over a range of 0.2 V.

Moreover, the particular form of the compensation circuit 308 is a non-limiting example, and other compensation circuits configured to provide control voltages that compensate for variations in $V_{TH}$ are within the scope of this disclosure. Compensation circuits can include other or additional circuit elements, such as capacitors, transistors, resistors, diodes, amplifiers, computing/processing elements, and other types of circuit element. For example, in some implementations a compensation circuit is configured to directly monitor a threshold voltage of a sensing transistor and to, in response to determining the threshold voltage, apply a control voltage. For example, the compensation circuit can include a processing element, such as a microprocessor, that executes an algorithm to determine a control voltage to be provided based on the measured threshold voltage. In some implementations, the compensation element includes a processing element that accesses a stored model or other algorithm to determine and supply a control voltage based on one or more parameters. For example, the processing element can be configured to access an algorithm that dictates a control voltage as a function of temperature, determine the temperature (e.g., using a thermistor or other temperature sensor of the compensation circuit), determine a control voltage using the algorithm based on the determined temperature, and supply the control voltage to the sensing transistor.

Moreover, the particular forms of other portions of the page buffer circuit 300, such as the precharging circuit 302, the bit line control circuit 304, and the latch circuit 306, are also exemplary. Other circuits configured to provide the functions described above over precharging, discharging, and readout phases are also within the scope of this disclosure. In addition, although the compensation circuit 308 has been described in the context of a page buffer circuit 300, the disclosed threshold voltage compensation methods can be incorporated in other types of circuits in which an on/off state of a transistor is sensed to indicate a result and/or in which the on/off state of the transistor is otherwise used to direct further circuit operations.

FIG. 7 illustrates an example of a process 700 for managing an integrated circuit according to one or more implementations of the present disclosure. For example, the integrated circuit can include a page buffer circuit, such as page buffer circuit 300, in a memory device. The memory device can be the memory device 116 of FIG. 1A or the memory device 200 of FIG. 2. The memory device can include a memory cell array having a number of memory cells, e.g., memory cells 141 of FIG. 1B or memory cells 157 of FIG. 1C. The memory cells are connected in series in columns with a number of memory cell lines (e.g., bit lines). The page buffer circuit can be a page buffer, such as a page buffer 222 of FIG. 2, coupled to a corresponding memory cell through a corresponding bit line. The page buffer circuit can be managed or controlled by a control logic, e.g., the control logic 204 of FIG. 2, in the memory device. The process 700 can be performed by the control logic managing the page buffer.

The integrated circuit can include a latch circuit (e.g., latch circuit 306 of FIG. 3) and a compensation circuit (e.g., compensation circuit 308 of FIG. 3). The latch circuit includes a latch (e.g., latch unit 346 of FIG. 3) and a sensing transistor (e.g., sensing transistor 310 of FIG. 3). The sensing transistor includes a gate terminal coupled to a sensing node (e.g., sensing node 318 of FIG. 3) and an additional terminal (e.g., a source terminal of the sensing transistor 310 of FIG. 3) coupled to the compensation circuit. The compensation circuit can be configured to apply a control voltage to the additional terminal to compensate for a variation of a threshold voltage of the sensing transistor.

In some implementations, the control voltage is based on a predetermined voltage (e.g., $V_{target}$) and on a matching voltage (e.g., $V_{TH}$ of compensation transistor 350 of FIG. 3) configured to have a variation substantially the same as the variation of the threshold voltage of the sensing transistor. The matching voltage can be substantially identical to the threshold voltage of the sensing transistor. The sensing transistor can be configured to receive a sensing (e.g., the voltage at the sensing node 318) at the gate terminal. The sensing transistor can be configured to sense a memory cell (e.g., memory cell 314) based on a comparison between the sensing voltage and the predetermined voltage, where the comparison is independent from the variation of the threshold voltage of the sensing transistor. For example, the sensing transistor can be configured to sense bit "0" in the memory cell when the sensing voltage varies in a range between a precharged voltage (e.g., a supply voltage such as VDDI of FIG. 3) and the predetermined voltage (e.g., when sensing transistor 310 is switched on), and to sense bit "1" stored in the memory cell when the sensing voltage is lower than the predetermined voltage (e.g., when the sensing transistor 310 is switched off). The range between the precharged voltage and the predetermined voltage can be constant and independent from the variation of the threshold voltage of the sensing transistor (e.g., a constant sensing swing of VDDI–$V_{target}$).

In some implementations, the compensation circuit includes a compensation transistor (e.g., compensation transistor 350 of FIG. 3) that matches the sensing transistor. A threshold voltage of the compensation transistor can be substantially identical to the threshold voltage of the sensing transistor. The compensation transistor can include a gate terminal coupled to a predetermined voltage (e.g., $V_{target}$ of FIG. 3), a first terminal coupled to a supply voltage (e.g., the drain terminal of the compensation transistor 350 coupled to supply voltage VDDI of FIG. 3), and a second terminal coupled to an input of a buffer circuit (e.g., the op-amp 352 of FIG. 3) configured to provide the control voltage at an output (e.g., at the source terminal of the sensing transistor 310). The control voltage can be based on the predetermined voltage and on the threshold voltage of the compensation transistor, e.g., identical to a difference between the predetermined voltage and the threshold voltage of the sensing transistor (e.g., $V_{target}$–$V_{TH}$). The control voltage can be provided at a source terminal of the compensation transistor. The control voltage can be a function of the threshold voltage of the sensing transistor.

In some implementations, the compensation circuit is configured to apply the control voltage such that the control voltage decreases in response to an increase in the threshold voltage, and such that the control voltage increases in response to a decrease in the threshold voltage. In some implementations, the compensation circuit is configured to apply the control voltage such that the control voltage decreases in response to a decrease in temperature, and such that the control voltage increases in response to an increase in temperature.

In some implementations, the compensation circuit is configured to apply the control voltage such that the sensing transistor is turned on or off independent of the variation of the threshold voltage of the sensing transistor (e.g., the sensing transistor is turned on or off based on a constant $V_{strobe}$ that is equal to $V_{target}$). The variation of the threshold voltage of the sensing transistor can be based on at least one of a temperature change or a process variation in fabrication of the sensing transistor. The control voltage can cause a turn-on condition of the sensing transistor to be independent of temperature changes within a predetermined temperature range. The control voltage can cause a switching voltage of the sensing transistor to be independent of process variations in fabrication of the sensing transistor.

In some implementations, the sensing transistor includes a third terminal (e.g., a drain terminal of the sensing transistor 310 of FIG. 3) configured to receive current flow (e.g., current 408 of FIG. 4C) during a readout operation of the integrated circuit (e.g., as shown in FIG. 4C). The integrated circuit can include a precharging circuit (e.g., precharging circuit 302 of FIG. 3) coupled to the sensing node (e.g., sensing node 318 of FIG. 3) and configured to precharge the sensing node to a supply voltage (e.g., VDDI of FIG. 3) during a precharging phase. The integrated circuit can include a bit line control circuit (e.g., bit line control circuit 304 of FIG. 3) having a first control node coupled to a bit line for a memory cell (e.g., a control node coupled to bit line 312 for memory cell 314 of FIG. 3) and a second control node coupled to the sensing node. The bit line control circuit can be configured to precharge the bit line during the precharging phase (e.g., as shown in FIG. 4A), and to discharge a sensing voltage of the sensing node by conductively connecting the sensing node with the bit line (e.g., by switching on transistor 326 of FIG. 4B) to provide a sensing current to the memory cell during a discharging phase subsequent to the precharging phase (e.g., as shown in FIG. 4B). In some implementations, the latch circuit is configured such that, during a readout phase, when the memory cell stores bit "1" and the sensing voltage at the sensing node is no greater than a target voltage, the sensing transistor is turned off to keep a bit value latched in the latch to be "1", and when the memory cell stores bit "0" and the sensing voltage at the sensing node is greater than the target voltage, the sensing transistor is turned on to set a bit value latched in the latch to be "0" (e.g., as shown in FIG. 4C). In some implementations, the integrated circuit includes a capacitor (e.g., capacitor 320 of FIG. 3) coupled to the sensing node.

The integrated circuit that is the subject of process 700 can include a latch configured to latch data (e.g., latch unit 346 of FIG. 3), a sensing transistor (e.g., sensing transistor 310 of FIG. 3) including a gate terminal coupled to a sensing node (e.g., sensing node 318 of FIG. 3), a first terminal coupled to the latch (e.g., a drain terminal of the sensing transistor 310), and a second terminal to receive a control voltage (e.g., a source terminal of the sensing transistor 310). The sensing transistor can be configured to be turned on or off to update the data in the latch based on (i) a sensing voltage at the sensing node and (ii) a target voltage based on the control voltage and on a threshold voltage of the sensing transistor (e.g., $V_{target}=V_{control}+V_{TH}$), where the control voltage is configured to compensate for a variation of the threshold voltage of the sensing transistor, such that the target voltage (e.g., $V_{target}$), is independent from the variation of the threshold voltage of the sensing transistor.

In the process 700, a control voltage is provided to a sensing transistor of an integrated circuit (702). The sensing transistor includes a gate terminal coupled to a sensing node and another terminal configured to receive the control voltage. For example, as shown in FIGS. 3 and 4A-4C, a control voltage is provided to a source terminal of sensing transistor 310, and a gate terminal of the sensing transistor 310 is coupled to sensing node 318. The control voltage is provided by compensation circuit 308.

During a discharging phase, a sensing voltage at the sensing node is discharged through a bit line coupled to a memory cell (704). For example, as shown in FIG. 4B, the sensing voltage at the sensing node 318 is discharged through bit line 312 to memory cell 314. As shown in FIG. 5, the sensing voltage changes from a charged value $V_{SEN,1}$ to a discharged value $V_{SEN,2}$.

A state of the memory cell is determined based on (i) the discharged sensing voltage and (ii) a target voltage based on the control voltage and on a threshold voltage of the sensing transistor (706). For example, as described in reference to FIG. 4C, when $V_{SEN,2}$ is greater than $V_{target}$ (where $V_{target}=V_{TH}+V_{control}$), the memory cell 314 is determined to store bit "0," and, when $V_{SEN,2}$ is no greater than $V_{target}$, the memory cell 314 is determined to store bit "1." The control voltage is configured to compensate for a variation of the threshold voltage of the sensing transistor, such that the target voltage is independent from the variation of the threshold voltage of the sensing transistor.

In some implementations, providing the control voltage includes providing a lower control voltage in response to an increase in the threshold voltage, and providing a higher control voltage in response to a decrease in the threshold voltage. In some implementations, providing the control voltage includes providing a lower control voltage in response to a decrease in temperature, such that the control voltage increases in response to an increase in temperature.

Variations, modifications, and enhancements to the described examples and implementations and other implementations can be made based on what is disclosed. For example, although this disclosure describes an example page buffer circuit 300 including an re-channel sensing transistor 310, in other implementations the sensing transistor can be a p-channel transistor, in which case some operations and circuit couplings (e.g., on/off states and source coupling compared to drain coupling) described above would be reversed, as would be understood by a person skilled in the art. As another example, although the control voltage is shown as being applied to a source terminal of the sensing transistor 310, in some implementations the control voltage can be applied to another terminal of the sensing transistor and/or elsewhere in the page buffer circuit 300 so as to compensate for $V_{TH}$ variations.

Aspects of the disclosed and other examples, such as control operations to provide $V_{target}$ or the control voltage, can be implemented as one or more computer program products, for example, one or more modules of computer program instructions encoded on a computer readable medium for execution by, or to control the operation of, data processing apparatus. The computer readable medium can be a machine-readable storage device, a machine-readable storage substrate, a memory device, or a combination of one or more them. The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A system may encompass all apparatus, devices, and machines for processing data, including by way of example a programmable processor, a computer, or multiple processors or computers. A system can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, and it can be deployed in any form, including as a standalone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed for execution on one computer or on multiple computers that are located at one site or distributed across multiple sites and interconnected by a communications network.

The processes and logic flows described in this document can be performed by one or more programmable processors executing one or more computer programs to perform the functions described herein. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer can include a processor for performing instructions and one or more memory devices for storing instructions and data. Generally, a computer can also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data can include all forms of nonvolatile memory, media and memory devices, including by way of example semiconductor memory devices, e.g., EPROM, EEPROM, and flash memory devices; magnetic disks. The processor and the memory can be supplemented by, or incorporated in, special purpose logic circuitry.

While this document may describe many specifics, these should not be construed as limitations on the scope of an invention that is claimed or of what may be claimed, but rather as descriptions of features specific to particular embodiments. Certain features that are described in this document in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination in some cases can be excised from the combination, and the claimed combination may be directed to a sub-combination or a variation of a sub-combination. Similarly, while operations are depicted in the drawings in a particular order, this should not be understood as requiring that such operations be performed in the particular order shown or in sequential order, or that all illustrated operations be performed, to achieve desirable results.

Only a few examples and implementations are disclosed. Variations, modifications, and enhancements to the described examples and implementations and other implementations can be made based on what is disclosed.

What is claimed is:

1. An integrated circuit comprising:
    a latch circuit comprising a latch and a sensing transistor coupled to the latch; and
    a compensation circuit coupled to the sensing transistor, wherein the sensing transistor comprises a gate terminal coupled to a sensing node and an additional terminal coupled to the compensation circuit, and
    wherein the compensation circuit is configured to apply a control voltage to the additional terminal to compensate for a variation of a threshold voltage of the sensing transistor.

2. The integrated circuit of claim 1, wherein the control voltage is based on a predetermined voltage and on a matching voltage configured to have a variation substantially the same as the variation of the threshold voltage of the sensing transistor.

3. The integrated circuit of claim 2, wherein the sensing transistor is configured to receive a sensing voltage at the gate terminal,
    wherein the sensing transistor is configured to sense a memory cell based on a comparison between the sensing voltage and the predetermined voltage, and
    wherein the comparison is independent from the variation of the threshold voltage of the sensing transistor.

4. The integrated circuit of claim 3, wherein the sensing transistor is configured to:
    sense bit "0" stored in the memory cell when the sensing voltage varies in a range between a precharged voltage and the predetermined voltage, and
    sense bit "1" stored in the memory cell when the sensing voltage is lower than the predetermined voltage.

5. The integrated circuit of claim 4, wherein the range between the precharged voltage and the predetermined voltage is constant and independent from the variation of the threshold voltage of the sensing transistor.

6. The integrated circuit of claim 1, wherein the compensation circuit comprises a compensation transistor that matches the sensing transistor.

7. The integrated circuit of claim 6, wherein the compensation transistor comprises:
    a compensation gate terminal coupled to a predetermined voltage;
    a first terminal coupled to a supply voltage; and
    a second terminal coupled to an input of a buffer circuit that is configured to provide the control voltage at an output.

8. The integrated circuit of claim 7, wherein the control voltage is identical to a difference between the predetermined voltage and a threshold voltage of the compensation transistor.

9. The integrated circuit of claim 7, wherein the threshold voltage of the sensing transistor varies in a range between a higher threshold voltage and a lower threshold voltage, and
    wherein the predetermined voltage is greater than or equal to the higher threshold voltage.

10. The integrated circuit of claim 7, wherein the compensation circuit is configured to provide the control voltage at a source terminal of the compensation transistor.

11. The integrated circuit of claim 1, wherein the compensation circuit is configured to apply the control voltage such the sensing transistor is turned on or off independent of the variation of the threshold voltage of the sensing transistor.

12. The integrated circuit of claim 1, further comprising:
    a precharging circuit coupled to the sensing node and configured to precharge the sensing node to a supply voltage during a precharging phase.

13. The integrated circuit of claim 12, further comprising:
    a bit line control circuit having a first control node coupled to a bit line for a memory cell and a second control node coupled to the sensing node,
    wherein the bit line control circuit is configured to:
        precharge the bit line during the precharging phase, and
        discharge a sensing voltage of the sensing node by conductively connecting the sensing node with the bit line to provide a sensing current to the memory cell during a discharging phase subsequent to the precharging phase.

14. The integrated circuit of claim 13, wherein the latch circuit is configured such that, during a readout phase:
    when the memory cell stores bit "1" and the sensing voltage at the sensing node is no greater than a target voltage, and the sensing transistor is turned off to keep a bit value latched in the latch to be "1", and
    when the memory cell stores bit "0" and the sensing voltage at the sensing node is greater than the target voltage, and the sensing transistor is turned on to set a bit value latched in the latch to be "0".

15. The integrated circuit of claim 1, wherein the sensing transistor is configured to receive a sensing voltage at the gate terminal,
    wherein the sensing transistor is configured to sense a memory cell based on a comparison between the sensing voltage and a predetermined voltage, and
    wherein the compensation circuit is configured to apply the control voltage such that the predetermined voltage is greater than a common voltage at a common node coupled to the gate terminal through an additional transistor.

16. A memory device comprising:
a memory cell array comprising a plurality of memory cells;
a plurality of memory cell lines connecting respective lines of memory cells in the memory cell array; and
a page buffer circuit comprising a plurality of page buffers coupled to the plurality of memory cell lines, each page buffer comprising:
  a latch circuit comprising a latch and a sensing transistor coupled to the latch; and
  a compensation circuit coupled to the sensing transistor,
  wherein the sensing transistor comprises a gate terminal coupled to a sensing node, a first terminal coupled to the latch, and a second terminal coupled to the compensation circuit, and
  wherein the compensation circuit is configured to apply a control voltage to the second terminal to compensate for a variation of a threshold voltage of the sensing transistor.

17. The memory device of claim 16, wherein the sensing transistor is configured to receive a sensing voltage at the gate terminal,
wherein the sensing transistor is configured to sense a memory cell based on a comparison between the sensing voltage and a predetermined voltage, and
wherein the comparison is independent from the variation of the threshold voltage of the sensing transistor.

18. The memory device of claim 16, wherein the compensation circuit comprises a compensation transistor that matches the sensing transistor, and
  wherein a threshold voltage of the compensation transistor is substantially identical to the threshold voltage of the sensing transistor.

19. The memory device of claim 18, wherein the compensation transistor comprises:
  a compensation gate terminal coupled to a predetermined voltage;
  a third terminal coupled to a supply voltage; and
  a fourth terminal coupled to an input of a buffer circuit that is configured to provide the control voltage at an output.

20. An integrated circuit comprising:
a latch configured to latch data; and
a sensing transistor comprising a gate terminal coupled to a sensing node, a first terminal coupled to the latch, and a second terminal to receive a control voltage,
wherein the sensing transistor is configured to be turned on or off to update the data in the latch based on (i) a sensing voltage at the sensing node and (ii) a target voltage based on the control voltage and on a threshold voltage of the sensing transistor, and
wherein the control voltage is configured to compensate for a variation of the threshold voltage of the sensing transistor, such that the target voltage is independent from the variation of the threshold voltage of the sensing transistor.

* * * * *